(12) United States Patent
Chiu

(10) Patent No.: US 12,495,602 B2
(45) Date of Patent: Dec. 9, 2025

(54) SEMICONDUCTOR CHIPS AND METHOD OF MANUFACTURING THEREOF

(71) Applicant: NANYA TECHNOLOGY CORPORATION, New Taipei (TW)

(72) Inventor: Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 431 days.

(21) Appl. No.: 18/208,176

(22) Filed: Jun. 9, 2023

(65) Prior Publication Data

US 2024/0413014 A1    Dec. 12, 2024

(51) Int. Cl.
| | |
|---|---|
| *H01L 21/82* | (2006.01) |
| *H01L 21/311* | (2006.01) |
| *H01L 21/3213* | (2006.01) |
| *H01L 23/522* | (2006.01) |
| *H01L 23/532* | (2006.01) |
| *H10D 84/01* | (2025.01) |

(52) U.S. Cl.
CPC ........ *H10D 84/01* (2025.01); *H01L 21/31116* (2013.01); *H01L 21/31144* (2013.01); *H01L 21/32133* (2013.01); *H01L 21/32139* (2013.01); *H01L 23/5226* (2013.01); *H01L 23/53238* (2013.01)

(58) Field of Classification Search
CPC ......... H01L 21/31116; H01L 21/31144; H01L 21/32133; H01L 21/32139; H01L 21/78; H01L 23/5226; H01L 23/53238; H10D 84/01
See application file for complete search history.

(56) References Cited

U.S. PATENT DOCUMENTS

| | | | | |
|---|---|---|---|---|
| 6,075,280 A | * | 6/2000 | Yung | H01L 21/304 257/797 |
| 2014/0167199 A1 | * | 6/2014 | Cheng | H01L 23/585 257/443 |
| 2015/0279808 A1 | * | 10/2015 | Shen | H01L 24/05 257/773 |

FOREIGN PATENT DOCUMENTS

| | | |
|---|---|---|
| TW | 202125815 | 7/2021 |
| TW | 202301451 A | 1/2023 |

* cited by examiner

*Primary Examiner* — Jaehwan Oh
(74) *Attorney, Agent, or Firm* — CKC & Partners Co., LLC

(57) ABSTRACT

The present disclosure provides a method of manufacturing semiconductor chips. The method includes performing a first dry etching process to remove a top metalization layer such that a portion of an interconnect structure is exposed by a scribe line opening after the top metalization layer is removed, wherein the interconnect structure is embedded in a dielectric layer. Next, a first wet etching process using a first etchant is performed to remove a filling layer of the interconnect structure. After performing the first wet etching process, a second wet etching process using a second etchant is performed to remove a glue layer of the interconnect structure. After performing a second wet etching process, a back side stealth dicing process is performed to induce cracks in a substrate from a back side to a front side so as to separate a semiconductor wafer into the semiconductor chips.

15 Claims, 12 Drawing Sheets

SEMICONDUCTOR CHIPS AND METHOD OF MANUFACTURING THEREOF

BACKGROUND

Field of Invention

The present disclosure relates to semiconductor chips and a method of manufacturing semiconductor chips.

Description of Related Art

In semiconductor wafer processing, integrated circuits are formed on a wafer (also referred to as a substrate) composed of silicon or other semiconductor material. Following the integrated circuit formation process, the wafer is "diced" to separate the individual chip from one another for packaging. However, the metal pad existed on the top of scribe line region may result in unwanted crack propagation, chipping or berr when separating the chips.

Accordingly, how to provide a method of manufacturing chips to solve the aforementioned problems becomes an important issue to be solved by those in the industry.

SUMMARY

The present disclosure provides a method of manufacturing semiconductor chips. The method includes performing a first dry etching process to remove a top metalization layer such that a portion of an interconnect structure is exposed by a scribe line opening after the top metalization layer is removed, wherein the interconnect structure is embedded in a dielectric layer. Next, performing a first wet etching process using a first etchant to remove a filling layer of the interconnect structure. After performing the first wet etching process, performing a second wet etching process using a second etchant to remove a glue layer of the interconnect structure. After performing a second wet etching process, performing a back side stealth dicing process to induce cracks in a substrate from a back side to a front side so as to separate a semiconductor wafer into the semiconductor chips.

The disclosure provides a method includes forming a photoresist before the first dry etching process to protect a device region and define the scribe line opening, wherein the top metalization layer is exposed by the scribe line opening.

The disclosure provides a method includes stripping the photoresist after the second dry etching process.

The disclosure provides a method, wherein the interconnect structure includes a plurality of conductive lines and a plurality of conductive vias. The conductive lines extending laterally in the dielectric layer, each conductive line including the filling layer and the glue layer. The conductive vias extending vertically in the dielectric layer, each conductive via including the filling layer and the glue layer, wherein the conductive vias connect the plurality of conductive lines in different levels.

The disclosure provides a method includes repeating the first wet etching process and the second wet etching process for more than one time until the interconnect structure is removed completely, wherein the filling layer and the glue layer of each conductive line are removed respectively, also, the filling layer and the glue layer of each conductive via are removed respectively.

The disclosure provides a method includes after performing the first wet etching process and the second wet etching process for more than one time, a hallow trace is formed after the interconnect structure is removed completely, wherein the hallow trace further includes a plurality of lateral cavities and a plurality of vertical cavities. The lateral cavities extend laterally in the dielectric layer. The vertical cavities extend vertically in the dielectric layer.

The disclosure provides a method, wherein the first etchant includes $H_3PO_4$ and $H_2O_2$.

The disclosure provides a method, wherein the second etchant includes KOH and $H_2O_2$.

The disclosure provides a method, wherein the filling layer includes copper, and the glue layer includes titanium and tantalum.

The disclosure provides a method, wherein after the back side stealth dicing process, the cracks inside the semiconductor wafer reach a bottom dielectric layer of the bottom metalization layer, and a plurality of hot cut lines are observed when observing the semiconductor wafer from the front side.

The disclosure provides a method, wherein the back side stealth dicing process includes applying a tensile force to the semiconductor wafer, so as to separate the semiconductor wafer into the semiconductor chips.

The disclosure provides a method, wherein a cutting tape is adhered to the substrate, and the step of applying a tensile force to the semiconductor wafer includes expanding the cutting tape outwardly.

The disclosure provides a semiconductor chip includes a substrate, a ring structure, a die, and a flange. The ring structure on the substrate includes a sidewall. The sidewall having a plurality of recesses, wherein the recesses extend in a direction parallel to the substrate. The die is on the substrate, wherein the die is surrounded by the ring structure, and the recesses extend toward the die. The flange is on the substrate, and the flange protruded from the sidewall of the ring structure.

The disclosure provides a semiconductor chip, wherein the flange includes a metal pad near the sidewall of the ring structure and a dielectric portion away from the sidewall of the ring structure.

The disclosure provides a semiconductor chip, wherein the metal pad includes tungsten.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

In order that the present disclosure is described in detail and completeness, implementation aspects and specific embodiments of the present disclosure with illustrative description are presented, but it is not the only form for implementation or use of the specific embodiments of the present disclosure. The embodiments disclosed herein may be combined or substituted with each other in an advantageous manner, and other embodiments may be added to an embodiment without further description. In the following description, numerous specific details will be described in detail in order to enable the reader to fully understand the following embodiments. However, the embodiments of the present disclosure may be practiced without these specific details.

Further, spatially relative terms, such as "beneath," "below," "over," "on," and the like, may be used herein for ease of description to describe one element or feature's relationship to another element(s) or feature(s) as shown in the figures. The true meaning of the spatially relative terms includes other orientations. For example, when the figure is flipped up and down by 180 degrees, the relationship between one component and another component may change from "beneath" or "below" to "over" or "on." In addition, the spatially relative descriptions used herein should be interpreted the same.

Figure 1:
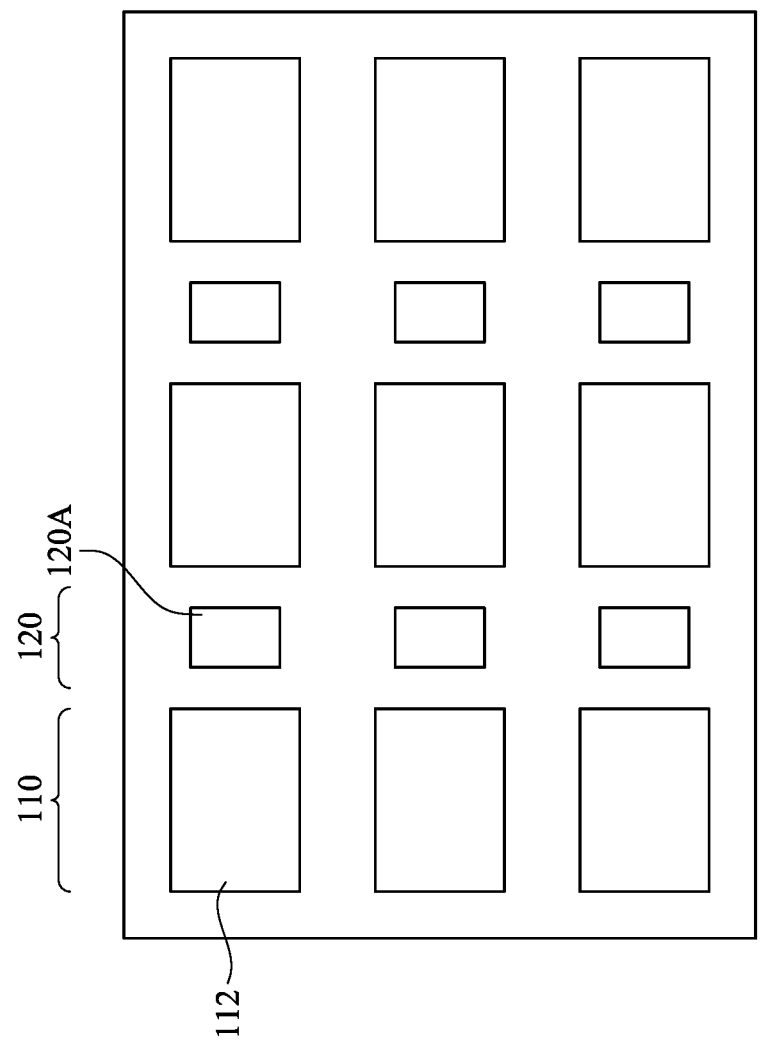
FIG. 1 is a top view of a schematic diagram of a semiconductor wafer, in accordance with some embodiments.

FIG. 1 is a top view of a schematic diagram of a semiconductor wafer 100, in accordance with some embodiments. As shown, the semiconductor wafer 100 includes a plurality of device regions 110 and a plurality of scribe line regions 120, wherein each scribe line region 120 is configured between two device regions 110. In some embodiments, each device region 110 may include a die 112. The die 112 may include semiconductor devices such as memories, microprocessors, application-specific integrated circuits (ASICs) or the like. In some embodiments, the die 112 is a dynamic random access memory (DRAM) chip. Each scribe line region 120 may include a testing element group 120a. The scribe line regions 120 are used to singulate or otherwise separate individual chips at the end of wafer processing. In such embodiments, the testing element group 120a may not be present on singulated chips.

Figure 2:
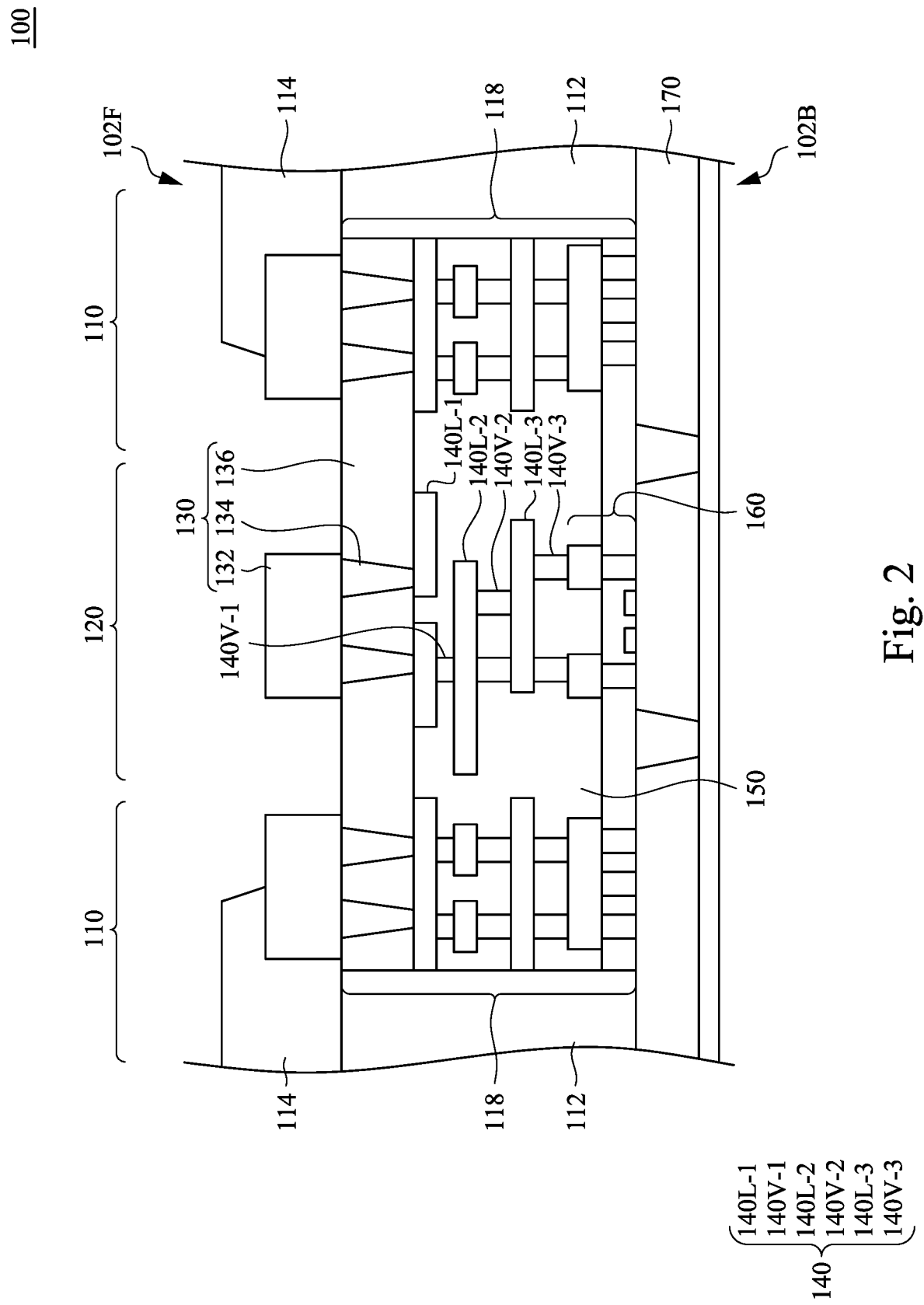
FIG. 2 is a cross-sectional view of a portion of the semiconductor wafer of FIG. 1, in accordance with some embodiments.

FIG. 2 is a cross-sectional view of a portion of the semiconductor wafer 100 of FIG. 1, in accordance with some embodiments. As shown, the semiconductor wafer 100 has a front side 102F and a back side 102B. In some embodiments, each device region 110 of the semiconductor wafer 100 may include a die 112 which deposed on a substrate 170. In some embodiments, the substrate 170 may be a single crystal semiconductor substrate or a polycrystalline semiconductor substrate made of silicon or silicon carbide, a compound semiconductor substrate made of silicon germanium or the like, a silicon on insulator (SOI) substrate, or the like. The die 112 may be surrounded by a ring structure 118, and the die 112 may be covered by a mask 114.

As shown, each scribe line region 120 may include a top metalization layer 130, a dielectric layer 150, and a bottom metalization layer 160 from front side 102F to back side 102B, respectively. The top metalization layer 130 may include a metal pad 132, a plurality of plugs 134, and a top dielectric layer 136, wherein the metal pad 132 is deposed on the top dielectric layer 136 and the plugs 134 are embedded in the top dielectric layer 136. For example, the metal pad 132 and the plugs 134 may include aluminum (Al). The top dielectric layer 136 may be a silicon oxide layer, a low-k dielectric layer, or the like.

The dielectric layer 150 may be a silicon oxide layer, a low-k dielectric layer, or the like. For example, the dielectric layer 150 may include an Inter-Metal Dielectric (IMD), in which an interconnect structure 140 is formed. In other words, the interconnect structure 140 is embedded in the dielectric layer 150. The interconnect structure 140 is used to provide electrical interconnection between the top metalization layer 130 and the bottom metalization layer 160, and the interconnect structure 140 is made of conductive materials.

The interconnect structure 140 may include a plurality of conductive lines and a plurality of conductive vias. The conductive lines extend laterally in the dielectric layer 150. As shown, the conductive lines may include first conductive lines 140L-1, second conductive lines 140L-2, and third conductive lines 140L-3. The conductive vias connect the conductive lines in different levels, in other words, the conductive vias extend vertically in the dielectric layer 150. As shown, the conductive vias may include first conductive vias 140V-1, second conductive vias 140V-2, and third conductive vias 140V-3. For example, the first conductive vias 140V-1 connect the first conductive lines 140L-1 and the second conductive lines 140L-2. The bottom metalization layer 160 is formed between the dielectric layer 150 and the substrate 170. A cutting tape 180 is adhered to the substrate 170 of the semiconductor wafer 100.

Figure 3:
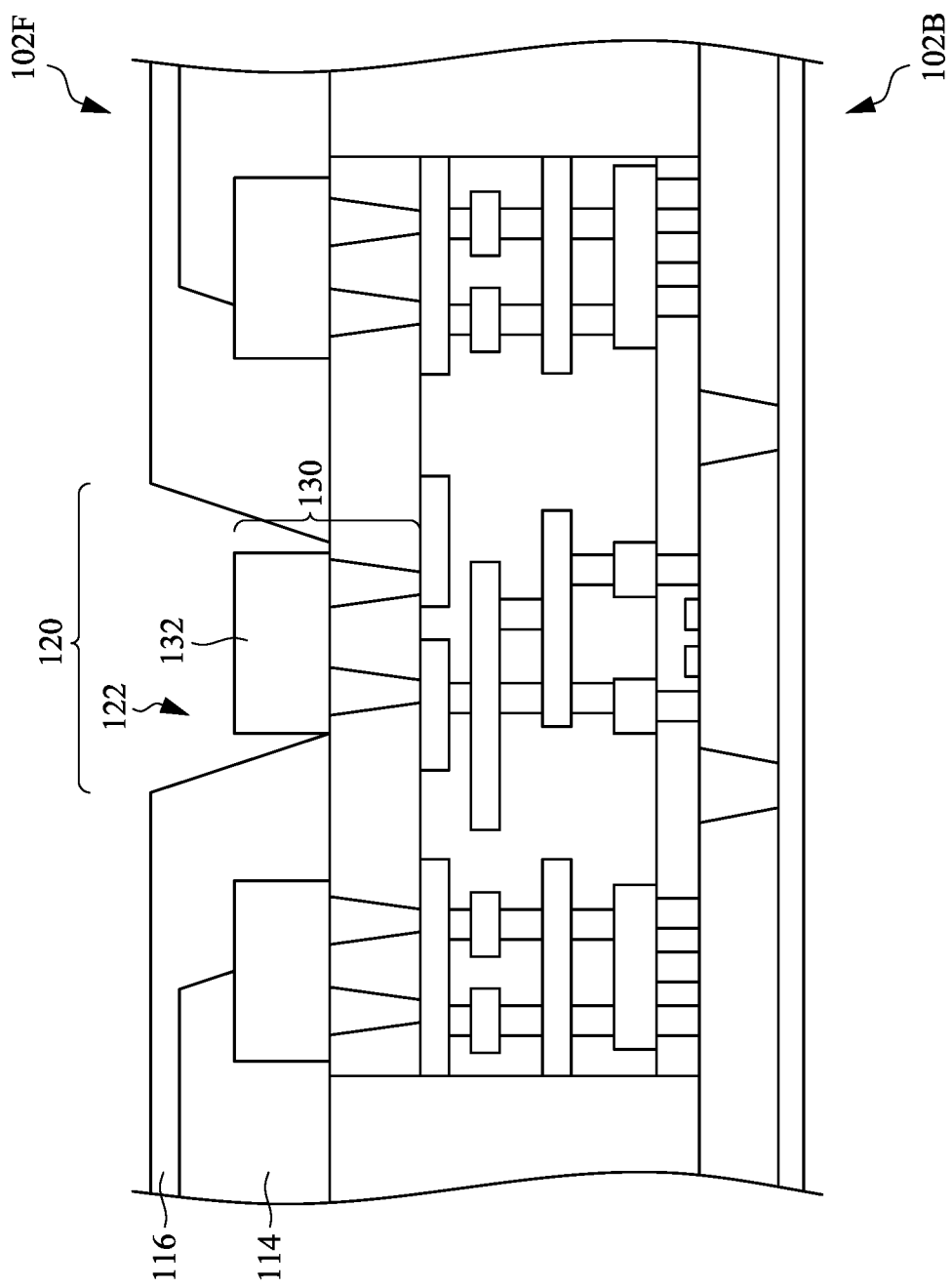
FIG. 3 is a cross-sectional view of a portion of the semiconductor wafer after forming photoresist, in accordance with some embodiments.

FIG. 3 is a cross-sectional view of a portion of the semiconductor wafer 100 after forming a photoresist 116, in accordance with some embodiments. As shown, the photoresist 116 is formed at the front side 102F, and may cover the mask 114 completely. In some embodiments, the photoresist 116 is patterned to define a scribe line opening 122 in each scribe line region 120, wherein the metal pad 132 is exposed by the scribe line opening 122. The metal pad 132 which exposed by the scribe line opening 122 may be used as a test pad, and may be a part of the testing element group 120a (shown in FIG. 1). The photoresist 116 can be patterned by a suitable method, such as photolithography patterning and etching. The photoresist 116 is formed to protect each device region 110 from subsequent etching processes, which will be discussed further below in FIG. 4-FIG. 8.

Figure 4:
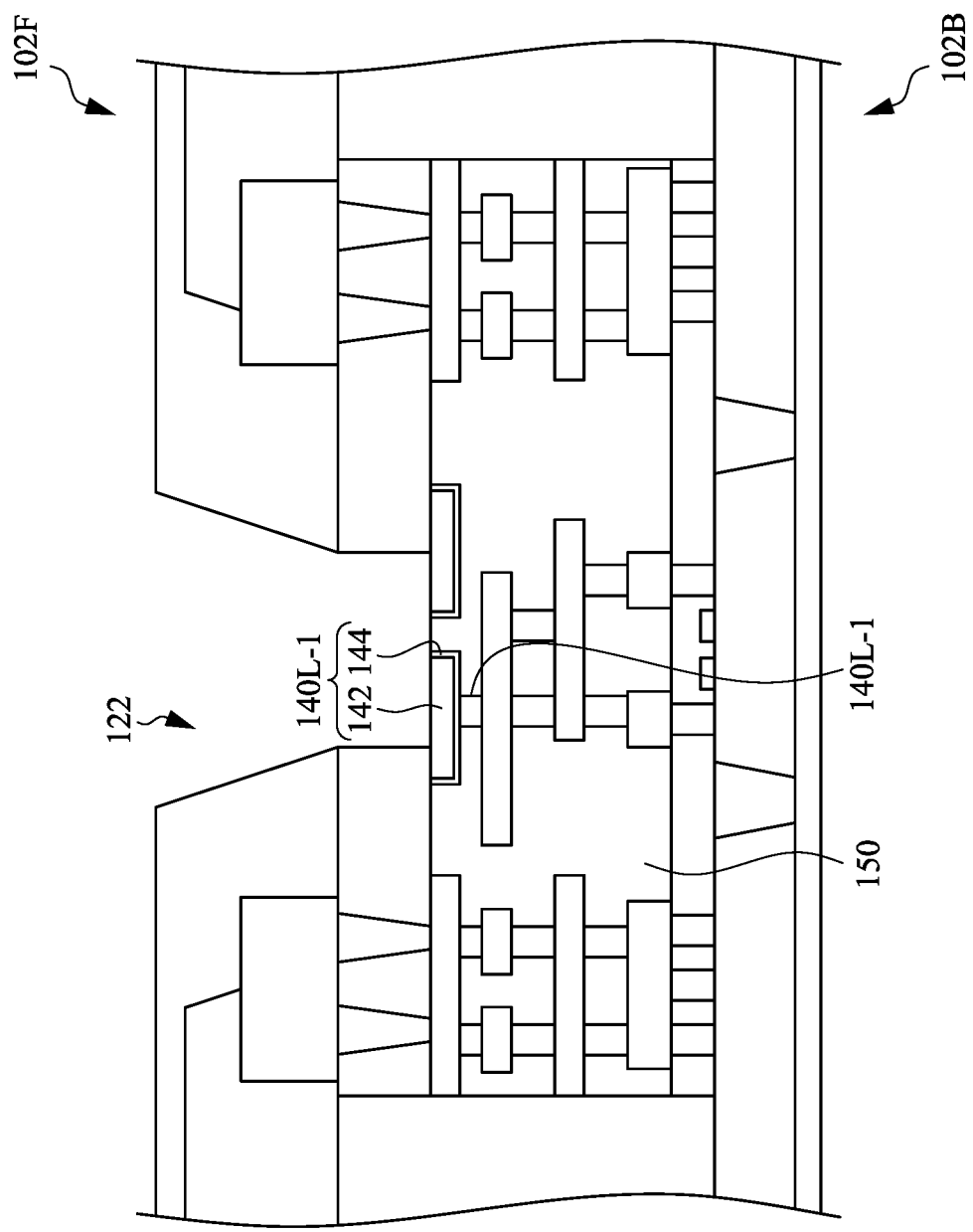
FIG. 4 is a cross-sectional view of a portion of the semiconductor wafer after performing a first dry etching process, in accordance with some embodiments.

FIG. 4 is a cross-sectional view of a portion of the semiconductor wafer 100 after performing a first dry etching process, in accordance with some embodiments. Each of the conductive lines may include a filling layer 142 and a glue layer. Each of the conductive vias may include a filling layer 142 and a glue layer 144. In order to make the figures concise, only the filling layer 142 and the glue layer 144 of the first conductive lines 140L-1 are shown, and are omitted in other figures. As shown, the top metalization layer 130 is removed by the first dry etching process, such that a portion of the filling layer 142 of the first conductive lines 140L-1 and a portion of the dielectric layer 150 are exposed by the scribe line opening 122 after the top metalization layer 130 is removed. For example, the first dry etching process may be reactive ion etching (RIE) process, or other suitable anisotropic etching processes.

Figure 5:
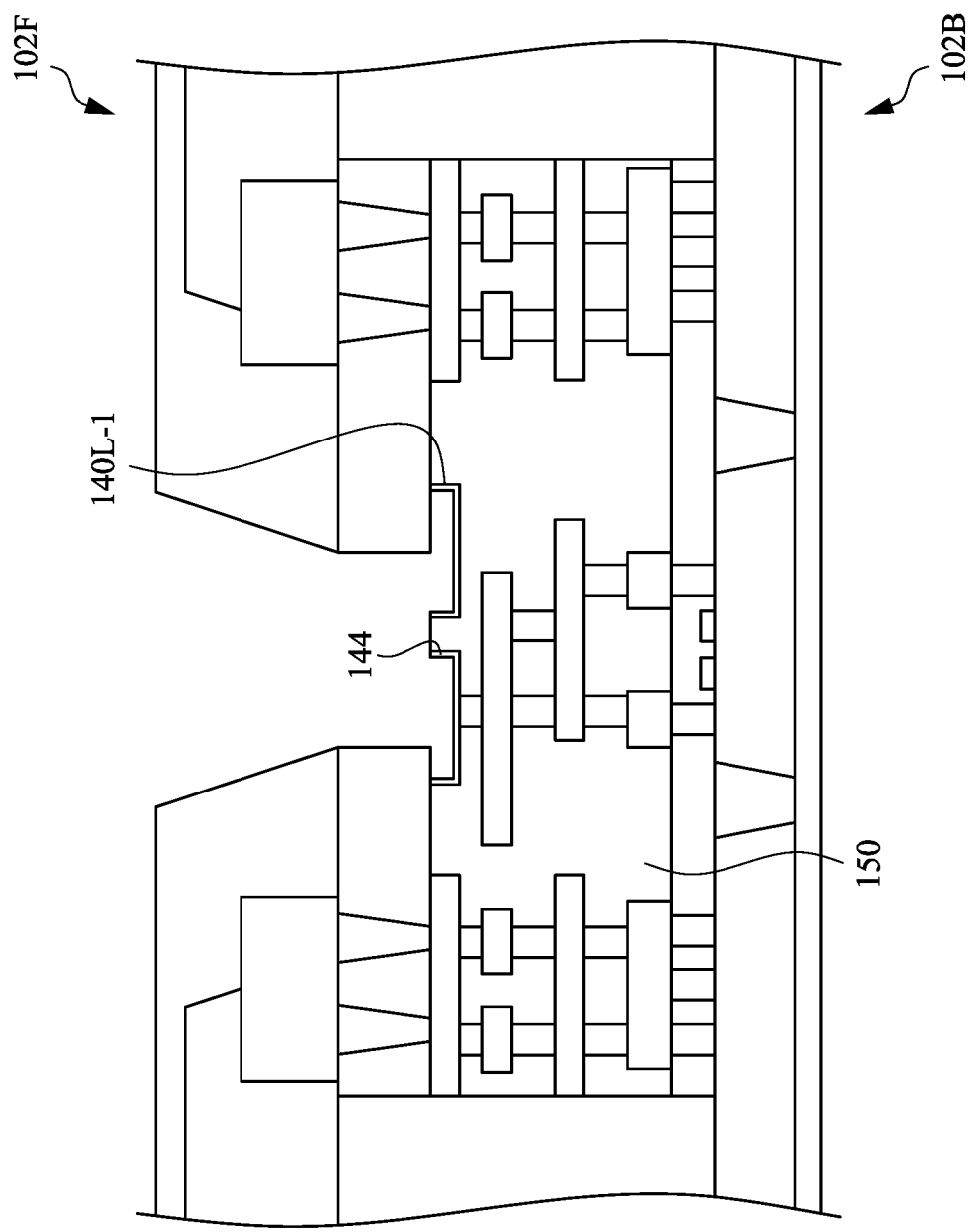
FIG. 5 is a cross-sectional view of a portion of the semiconductor wafer after performing a first wet etching process, in accordance with some embodiments.

FIG. 5 is a cross-sectional view of a portion of the semiconductor wafer 100 after a performing first wet etching process, in accordance with some embodiments. In some embodiments, the filling layer 142 may be copper (Cu). Since, it is hard to remove Cu by dry etching process, and may generate undesired product, the first wet etching process using a first etchant is performed to remove the filling layer 142 of the first conductive lines 140L-1. The glue layer 144 of the first conductive lines 140L-1 is exposed after the filling layer 142 is removed. As shown, the glue layer 144 is a thin shell making the filling layer 142 easier to be deposited. For example, the first etchant may include $H_3PO_4$ and $H_2O_2$. Due to etch selectivity, the dielectric layer 150 made by low-k material and the glue layer 144 are still remained after the first wet etching process.

Figure 6:
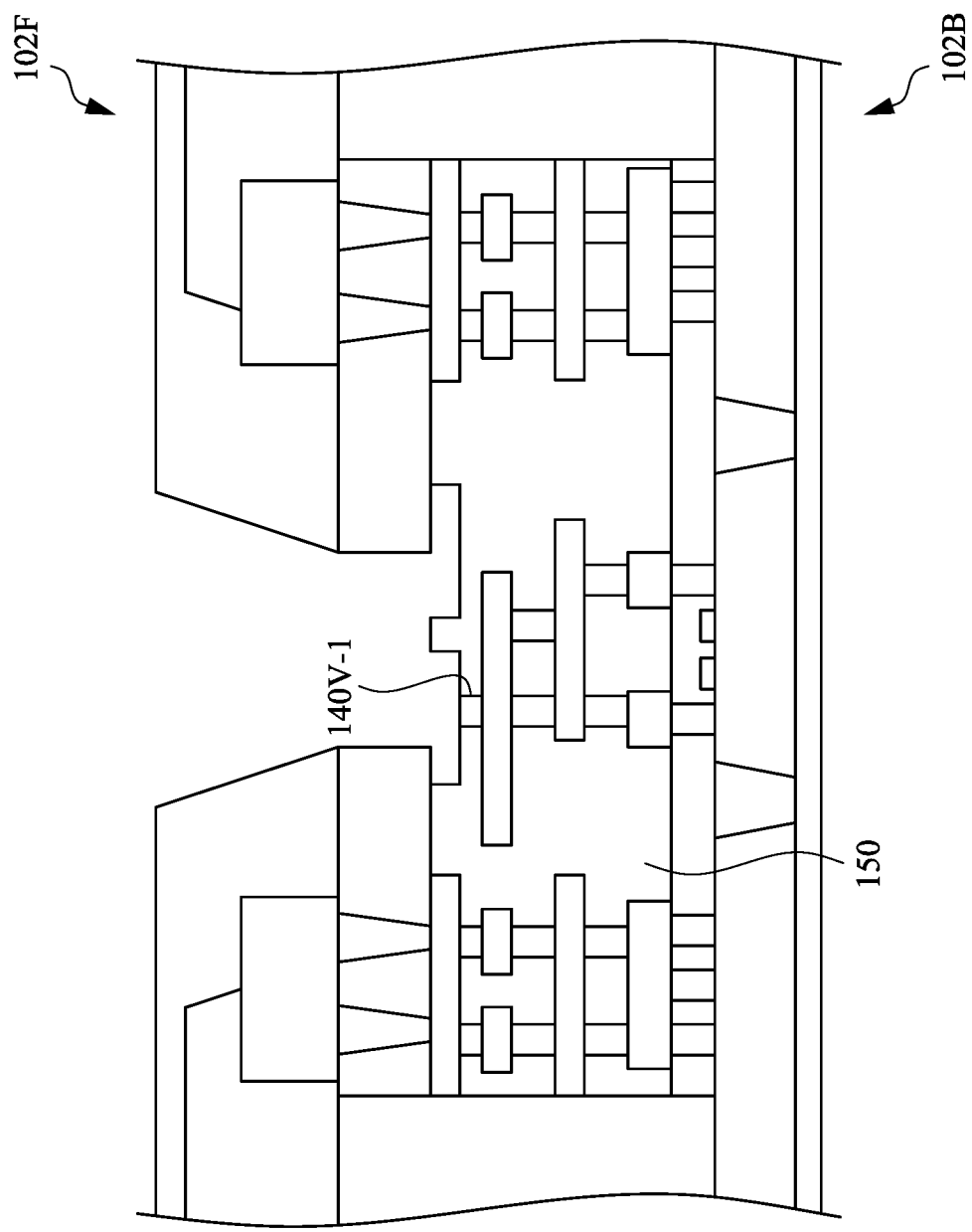
FIG. 6 is a cross-sectional view of a portion of the semiconductor wafer after performing a second wet etching process, in accordance with some embodiments.

FIG. 6 is a cross-sectional view of a portion of the semiconductor wafer 100 after performing a second wet etching process, in accordance with some embodiments. In some embodiments, the glue layer 144 may include titanium (Ti) and tantalum (Ta). As shown, the second wet etching process using a second etchant is performed to remove the glue layer 144 of the first conductive lines 140L-1. The first conductive vias 140V-1 are exposed after the glue layer 144 of the first conductive lines 140L-1 are removed. For example, the second etchant may include KOH and $H_2O_2$. The dielectric layer 150 is still remained after the second wet etching process.

Figure 7:
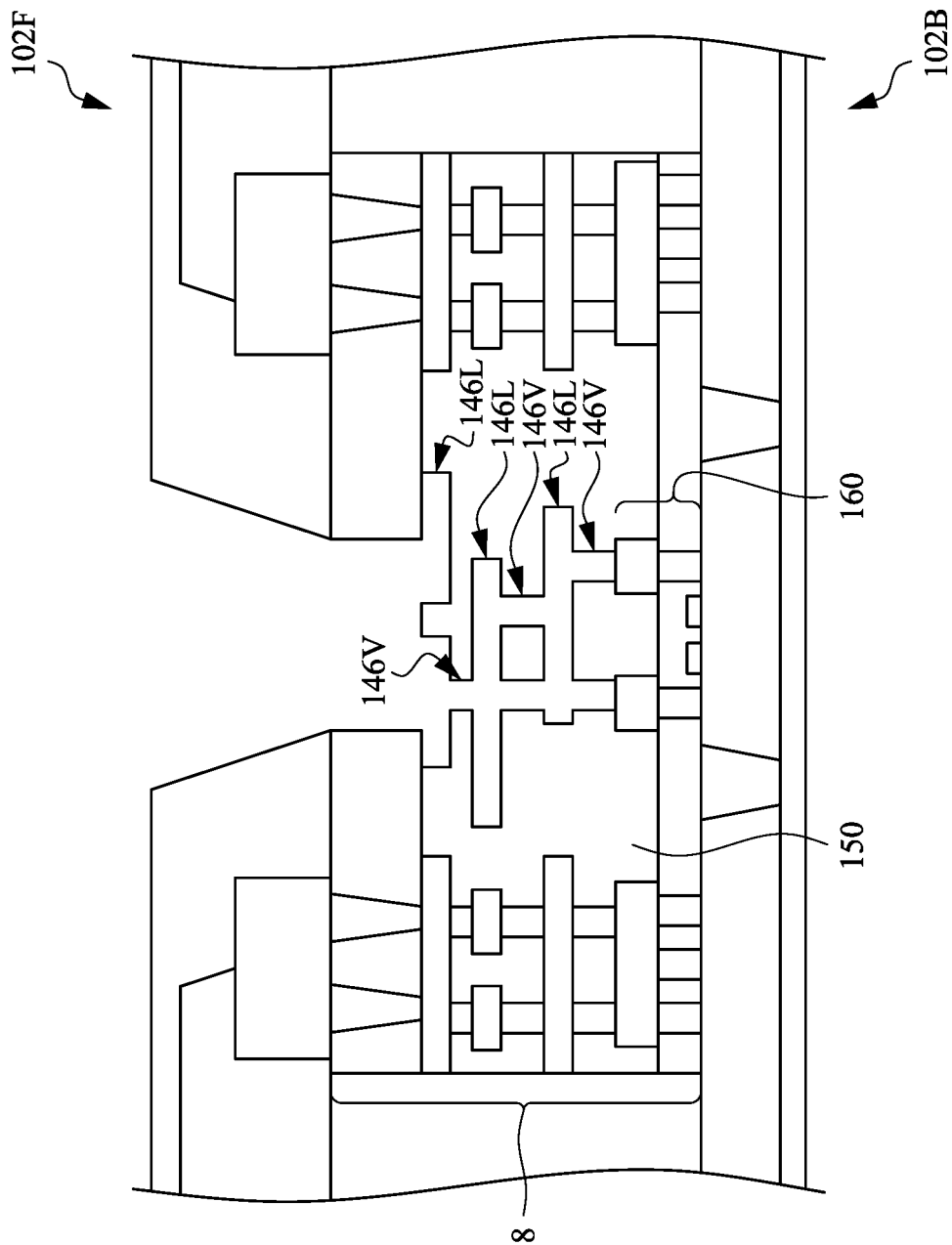
FIG. 7 is a cross-sectional view of a portion of the semiconductor wafer after repeating the first wet etching process and the second wet etching process for several times, in accordance with some embodiments.

FIG. 7 is a cross-sectional view of a portion of the semiconductor wafer 100 after repeating the first wet etching process and the second wet etching process for several times, in accordance with some embodiments. In some embodiments, repeat the first wet etching process and the second wet etching process for several times to remove the interconnect structure 140 completely. Since the dielectric layer 150 is still remained after the first wet etching process and the second wet etching process, a hallow trace 146 is formed after the interconnect structure 140 is removed completely. The hallow trace 146 may include lateral cavities 146L and vertically cavities 146V. The lateral cavities 146L extend laterally in the dielectric layer 150. The vertically cavities 146V extend vertically in the dielectric layer 150, and the lateral cavities 146L at different levels are connected by the vertically cavities 146V. A portion of the bottom metalization layer 160 is exposed by the hallow trace 146. A portion of the lateral cavities 146L will remain on the sidewall of the ring structure 118 and will be described in detail below.

Figure 8:
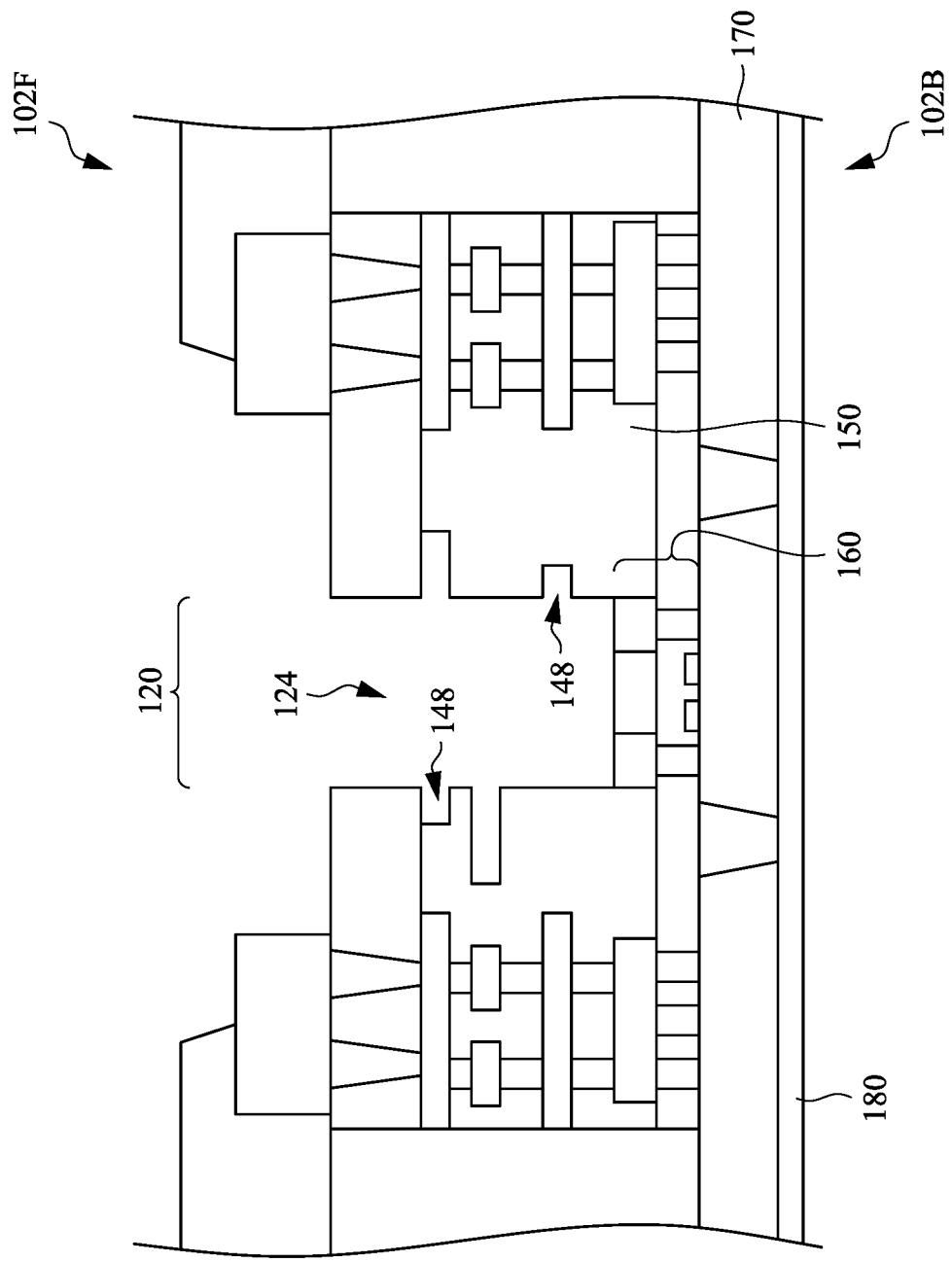
FIG. 8 is a cross-sectional view of a portion of the semiconductor wafer after performing a second dry etching process, in accordance with some embodiments.

FIG. 8 is a cross-sectional view of a portion of the semiconductor wafer 100 after performing a second dry etching process, in accordance with some embodiments. After the interconnect structure 140 is completely removed, it is easy to perform a dry etching process. As shown, the second dry etching process is performed to remove the dielectric layer 150, and the second dry etching process stops at the bottom metalization layer 160, wherein the scribe line opening 122 is deepened and form a scribe line open area 124. The bottom metalization layer 160 is exposed by the scribe line open area 124. For example, the second dry etching process may be reactive ion etching (RIE) process, or other suitable anisotropic etching processes. In some embodiments, the method further includes stripping the photoresist 116 after the second dry etching process is performed. The above etching processes thin the layers of the scribe line region 120 from the front side 102F and is benefit to facilitate the subsequent back side stealth dicing process.

Figure 9A:
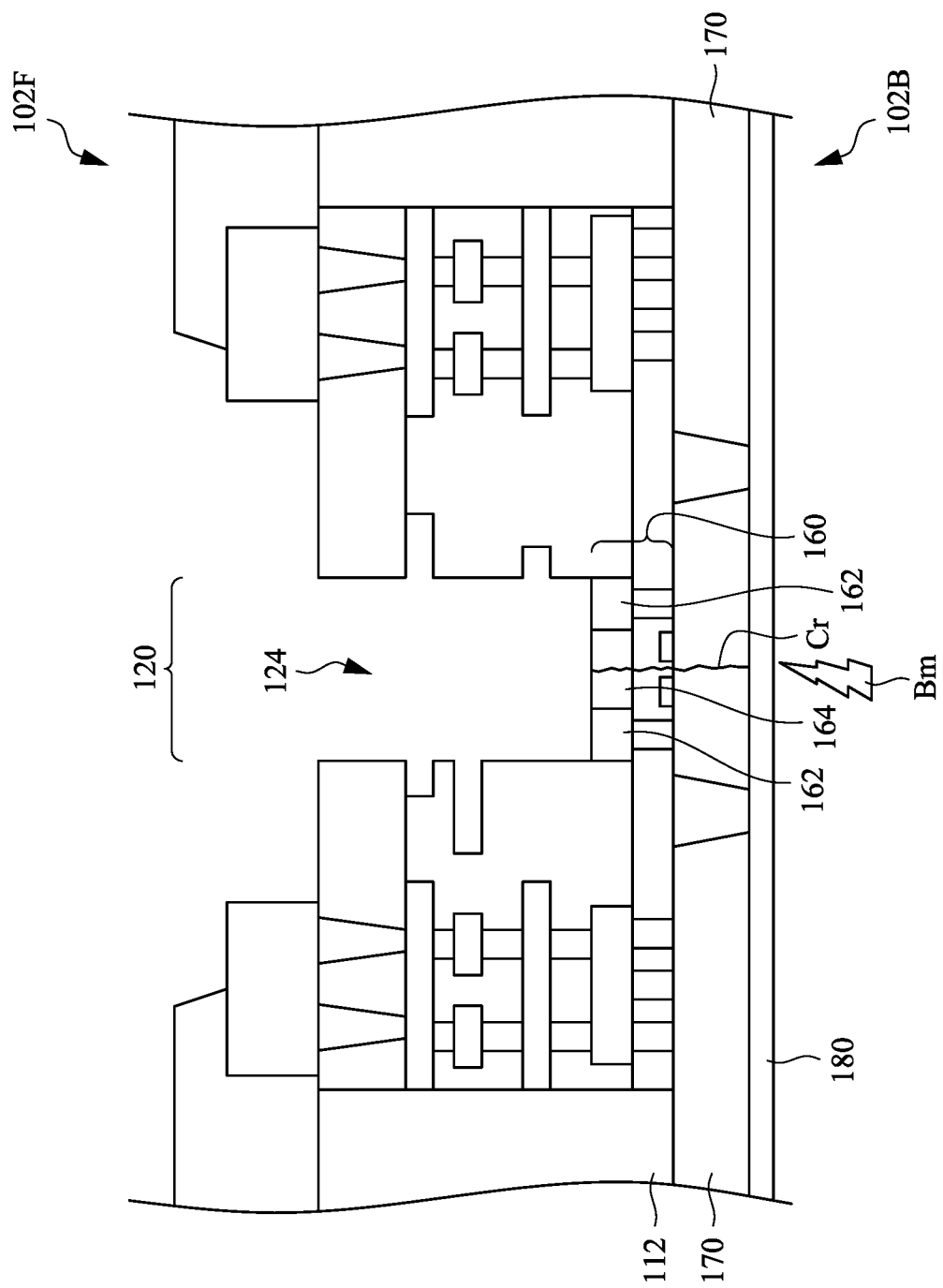
FIGS. 9A and 9B are a cross-sectional view and a top view of the semiconductor wafer after performing a back side stealth dicing process, respectively, in accordance with some embodiments.
Figure 9B:
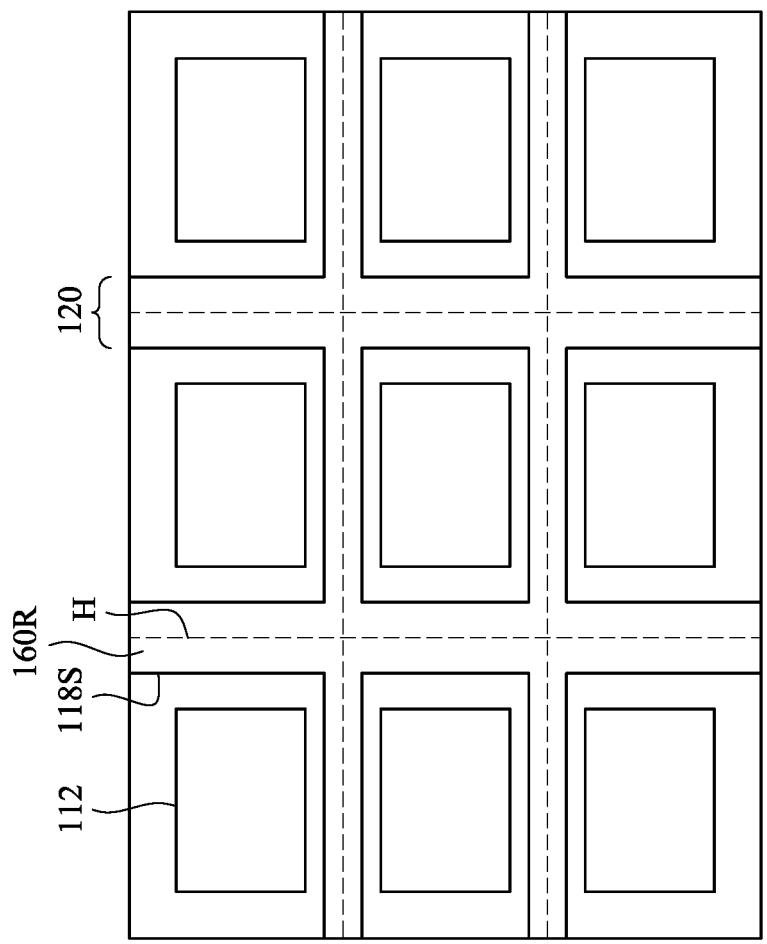

FIGS. 9A and 9B are a cross-sectional view and a top view of the semiconductor wafer after performing back side stealth dicing process, respectively, in accordance with some embodiments. As shown, the bottom metalization layer 160 may further include metal pads 162 and a bottom dielectric layer 164, wherein the metal pads 162 may include tungsten (W). The material of the dielectric layer 150 and the material of the bottom dielectric layer 164 may be the same or different. The back side stealth dicing process includes irradiating a laser beam Bm at the scribe line region 120 from the back side 102B. The laser beam Bm may induce cracks Cr from the back side 102B toward the front side 102F inside the substrate 170. The cracks Cr may eventually reach the bottom dielectric layer 164 of the bottom metalization layer 160. As shown in FIG. 9B, when the cracks Cr reach the bottom dielectric layer 164, a plurality of hot cut lines H can be observed when observing the semiconductor wafer 100 from the front side 102F.

Figure 10A:
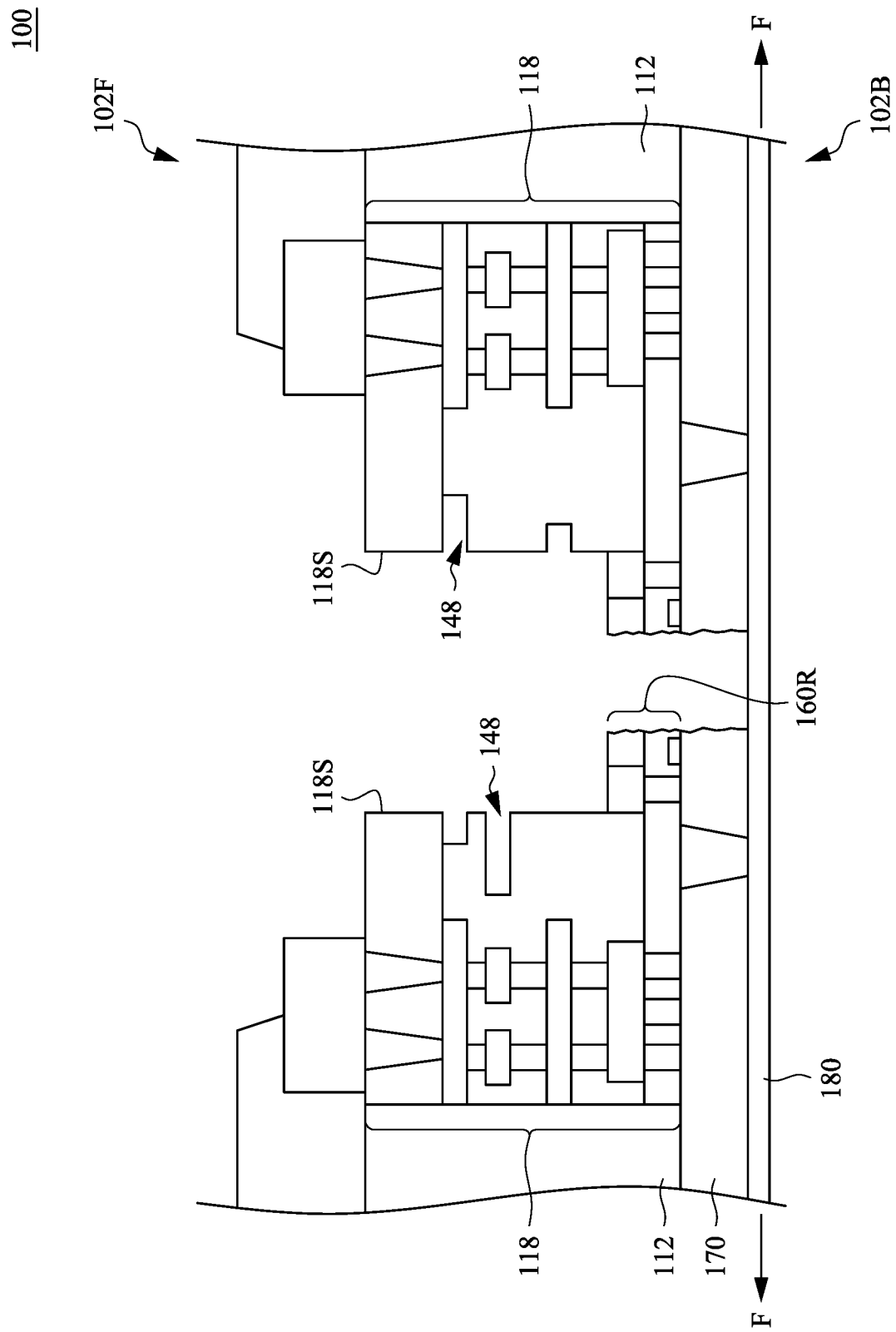
FIGS. 10A and 10B are a cross-sectional view and a top view of the semiconductor wafer after applying a tensile force to the semiconductor wafer, respectively, in accordance with some embodiments.
Figure 10B:
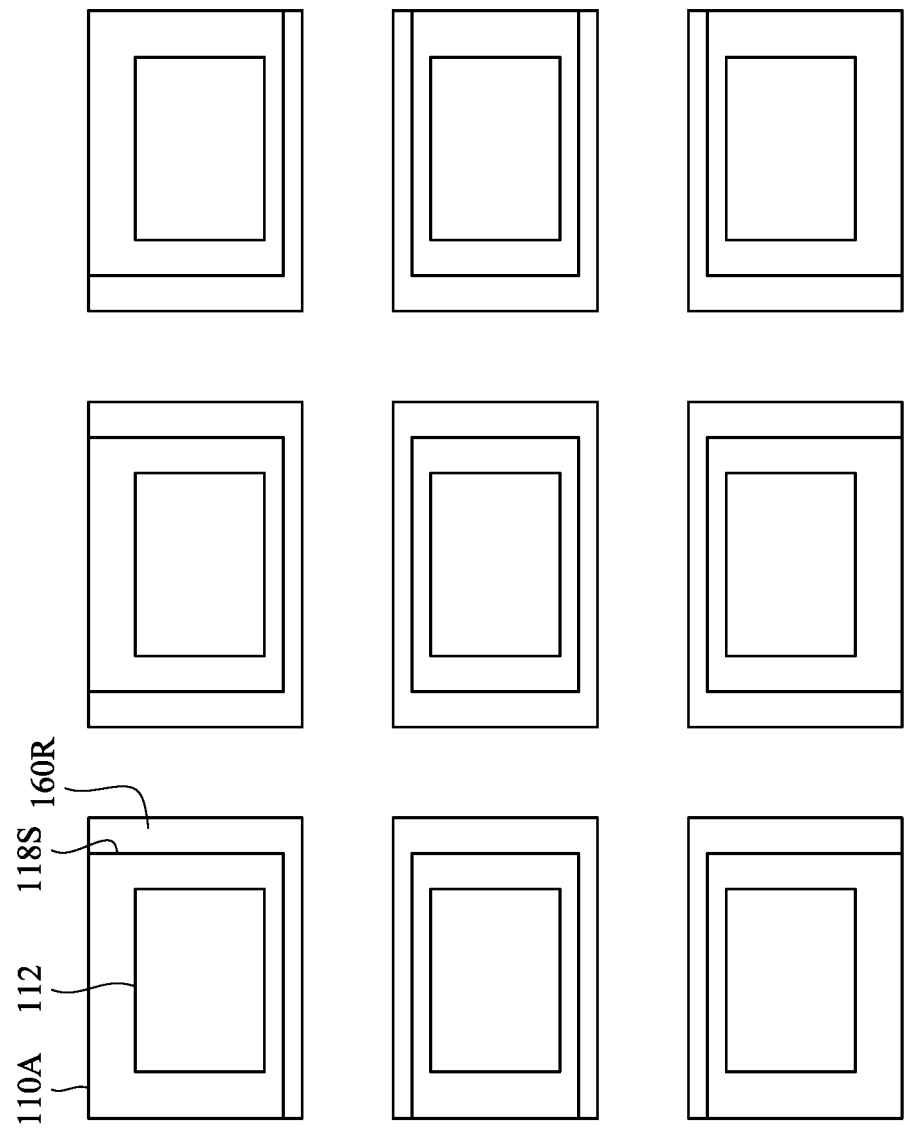

FIGS. 10A and 10B are a cross-sectional view and a top view of the semiconductor wafer after applying a tensile force to the semiconductor wafer, respectively, in accordance with some embodiments. In this step, apply a tensile force F to expand the cutting tape 180 outwardly. Then, as shown in FIG. 10B, the semiconductor wafer 100 is separated into individual semiconductor chips 110A.

Each semiconductor chip 110A includes the die 112, the ring structure 118, the substrate 170 and a flange 160R. The die 112, the ring structure 118 and the flange 160R are disposed on the substrate 170. The die 112 is surrounded by the ring structure 118. There are a plurality of recesses 148 on a ring structure sidewall 118S. The recesses 148 are the remaining portions of the lateral cavities 146L of the hallow trace 146 (shown in FIG. 7) after the semiconductor wafer 100 is separated into individual semiconductor chips 110A. The recesses 148 extend laterally toward the die 112. In other words, the recesses 148 extend in a direction almost parallel to the substrate 170. The flange 160R protrudes from the ring structure sidewall 118S, wherein the flange 160R is the remaining portions of the bottom metalization layer 160 after the semiconductor wafer 100 is separated into individual semiconductor chips 110A.

The embodiments of the present disclosure have some advantageous features. With the arrangement of the first dry etching process, the first wet etching process, the second wet etching process, and the second dry etching process, the method proposed in this disclosure properly thins the layers of the scribe line region. In particular, inserting wet etching processes between dry etching processes may reduce undesired products when etching the metal lines. Moreover, the method provide in the present disclosure may reduce the generation of berr and reduce chipping when separating semiconductor chips.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of manufacturing semiconductor chips, comprising:
    performing a first dry etching process to remove a top metalization layer such that a portion of an interconnect structure is exposed by a scribe line opening after the top metalization layer is removed, wherein the interconnect structure is embedded in a dielectric layer;
    performing a first wet etching process using a first etchant to remove a filling layer of the interconnect structure;
    after performing the first wet etching process, performing a second wet etching process using a second etchant to remove a glue layer of the interconnect structure;
    performing a second dry etching process to remove the dielectric layer and stop at a bottom metalization layer, wherein the scribe line opening is deepened and form a scribe line open area; and
    performing a back side stealth dicing process to induce cracks in a substrate from a back side to a front side so as to separate a semiconductor wafer into the semiconductor chips.

2. The method of claim 1, further comprising
    forming a photoresist before the first dry etching process to protect a device region and define the scribe line opening, wherein the top metalization layer is exposed by the scribe line opening.

3. The method of claim 2, further comprising stripping the photoresist after the second dry etching process.

4. The method of claim 1, wherein the interconnect structure comprises:
    a plurality of conductive lines extending laterally in the dielectric layer, each conductive line comprising the filling layer and the glue layer; and
    a plurality of conductive vias extending vertically in the dielectric layer, each conductive via comprising the filling layer and the glue layer;
    wherein the plurality of conductive vias connect the plurality of conductive lines in different levels.

5. The method of claim 4, further comprising repeating the first wet etching process and the second wet etching process for more than one time until the interconnect structure is removed completely,
    wherein the filling layer and the glue layer of each conductive line are removed respectively, also, the filling layer and the glue layer of each conductive via are removed respectively.

6. The method of claim 5, wherein after performing the first wet etching process and the second wet etching process for more than one time, a hallow trace is formed after the interconnect structure is removed completely, wherein the hallow trace comprises:
    a plurality of lateral cavities extending laterally in the dielectric layer; and
    a plurality of vertical cavities extending vertically in the dielectric layer.

7. The method of claim 1, wherein the first etchant comprises $H_3PO_4$ and $H_2O_2$.

8. The method of claim 1, wherein the second etchant comprises KOH and $H_2O_2$.

9. The method of claim 1, wherein the filling layer comprises copper, and the glue layer comprises titanium and tantalum.

10. The method of claim 1, wherein after the back side stealth dicing process, the cracks inside the semiconductor wafer reach a bottom dielectric layer of the bottom metalization layer, and a plurality of hot cut lines are observed when observing the semiconductor wafer from the front side.

11. The method of claim 1, wherein the back side stealth dicing process comprises:
    applying a tensile force to the semiconductor wafer, so as to separate the semiconductor wafer into the semiconductor chips.

12. The method of claim 11, wherein a cutting tape is adhered to the substrate, and the step of applying a tensile force to the semiconductor wafer comprises expanding the cutting tape outwardly.

13. A semiconductor chip, comprising:
    a substrate;
    a ring structure on the substrate, comprising:
        a sidewall having a plurality of recesses, wherein the recesses extend in a direction parallel to the substrate;
    a die on the substrate, wherein the die is surrounded by the ring structure, and the plurality of recesses extend toward the die; and
    a flange on the substrate and protruded from the sidewall of the ring structure.

14. The semiconductor chip of claim 13, wherein the flange comprises:
    a metal pad near the sidewall of the ring structure; and
    a dielectric portion away from the sidewall of the ring structure.

15. The semiconductor chip of claim 14, wherein the metal pad comprises tungsten.

* * * * *